United States Patent [19]

Yokoyama

[11] Patent Number: 4,692,687
[45] Date of Patent: Sep. 8, 1987

[54] OPTICAL PULSE RECEIVING DEVICE
[75] Inventor: Makoto Yokoyama, Seto, Japan
[73] Assignee: Kawamura Electric Industry Co., Ltd., Seto, Japan
[21] Appl. No.: 861,517
[22] Filed: May 9, 1986
[30] Foreign Application Priority Data May 17, 1985 [JP] Japan .................................. 60-106664

[51] Int. Cl.[4] ................................................ G05F 1/46
[52] U.S. Cl. ...................................... 323/284; 323/902
[58] Field of Search ............... 323/270, 274, 280, 284, 323/902

[56] References Cited

U.S. PATENT DOCUMENTS 3,780,318 12/1973 Werts et al. .................... 323/902 X

OTHER PUBLICATIONS

Chang, "Current Controlled Signal Divider and Photo-detector Circuit", IBM Technical Disclosure Bulletin, vol. 14, No. 12, May 1972, pp. 3842–3843.
Gianos, "Threshold Detector for Optical Transducers", IBM Technical Disclosure Bulletin, vol. 19, No. 10, Mar. 1977, pp. 3661–3662.

Primary Examiner—Peter S. Wong
Attorney, Agent, or Firm—Lahive & Cockfield

[57] ABSTRACT

An optical pulse receiving device converts an optical pulse signal into an electric signal, maintains a maximum value of the electric signal and sets a threshold voltage at one-half the maintained signal using a resistor divider. A comparison circuit compares the converted electrical signal with the threshold voltage and emits an output pulse on the basis of the comparison of the two signals. The output pulse is a square pulse with accurate timing.

2 Claims, 3 Drawing Figures

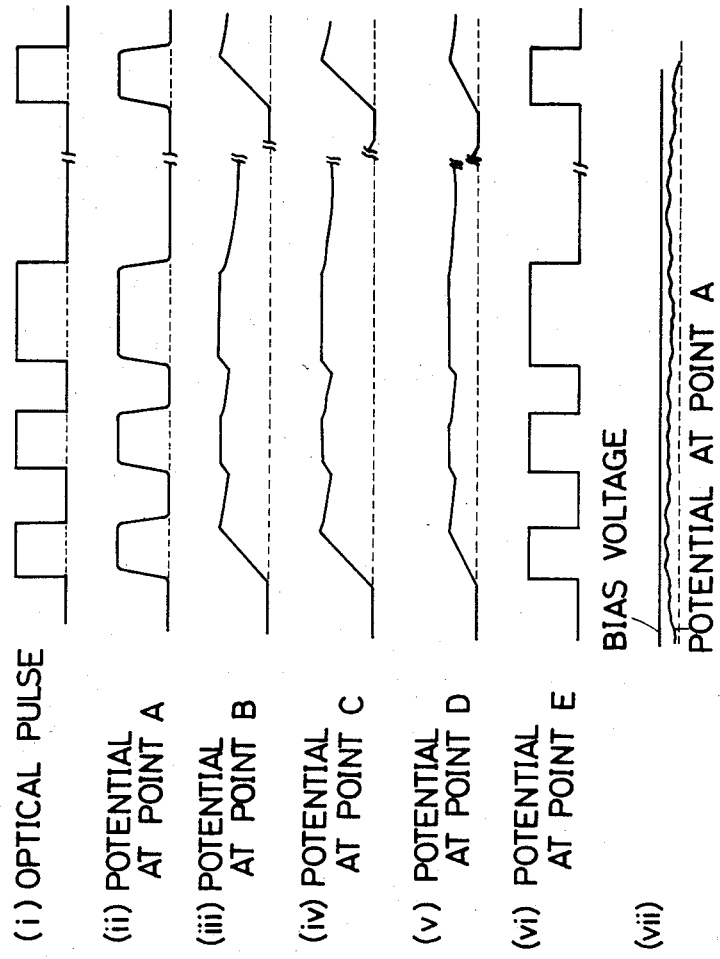

OPTICAL PULSE RECEIVING DEVICE

FIELD OF THE INVENTION

This invention relates to a circuit for finally receiving optical pulse signals in an undistorted condition and in a standarized strength.

BACKGROUND OF THE INVENTION

Generally, in the conventional optical pulse signal receiving circuit, the output voltage has been amplified by an operational amplifier and the like with the help of light receiving elements such as a phototransistor.

However, in the conventional receiving circuit, the optical pulse signal received was distorted, e.g., during rise of the output amplitude or when the pulse voltage is reduced, due to response characteristics of the phototransistor, operational amplifier, and the like. In particular, where multistep transmission of data is to be made by reproducing an optical signal on the basis of the received signal, cases have occurred in which distortions of the signals are combined to become a serious defect for practical use. Also, optical pulse signals are not necessarily received in the same strengths because of attenuation thereof during transmission. Therefore, it has been necessary to provide a signal strength correction circuit, especially where multistep transmission of data is to be made.

SUMMARY OF THE INVENTION

The primary object of the invention is to provide a circuit whereby optical pulse signals can be finally received in an undistorted condition and standarized strength.

Other objects of the invention will become apparent upon consideration of a detailed description of the invention which will follow.

With reference to FIG. 1, if an optical pulse signal with such a waveform as shown in (A) of FIG. 1 is received by an optical signal receiving device, the signal waveform (A) is somewhat distorted as shown by (a) in (B) of FIG. 1, due to delay in response of a photodiode, an operational amplifier, and the like, and then is output from a photoelectric conversion circuit. This output (a) is applied, as it is, to one of two input terminals of a comparison circuit. On the other hand, (b) of (B) of FIG. 1 designates the voltage obtained by reducing the maximum value of pulse voltage of the output of the photoelectric conversion circuit, by a predetermined percentage. Specifically, in the example of FIG. 1, the voltage (b) is one half of the foregoing maximum value of pulse voltage. This voltage (b) is applied to the other input terminal of the comparison circuit. The comparison circuit compares the magnitudes of the two input voltages (a) and (b). Then, the comparison circuit may be adapted to give a higher output if the voltage (a) is greater than (b) and to give a lower output if the former is smaller than the latter, so as to provide the pulse signal under the same waveform (C) as it has been received at first. Thus, optical pulses may be received by the present device in an undistorted condition and in a fixed strength.

BRIEF DESCRIPTION OF THE DRAWINGS

FIG. 3 illustrates the operation of the embodiment of FIG. 3.

DETAILED DESCRIPTION OF THE PREFERRED EMBODIMENT

Figure 1:
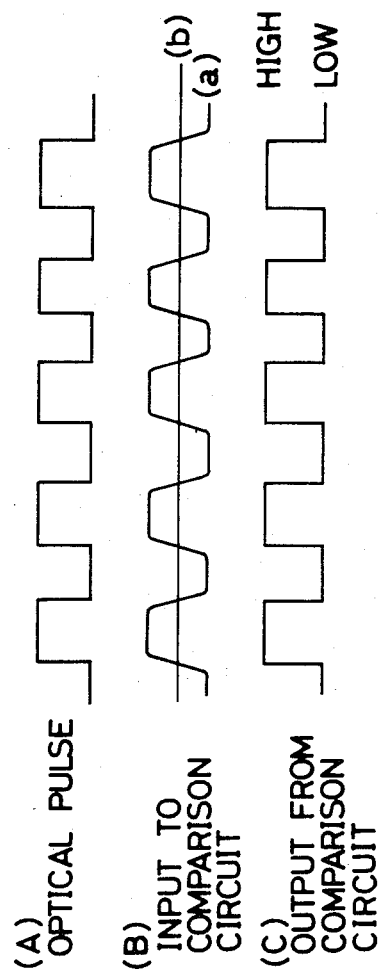
FIG. 1 illustrates the principle of an optical pulse receiving device according to the invention.
Figure 2:
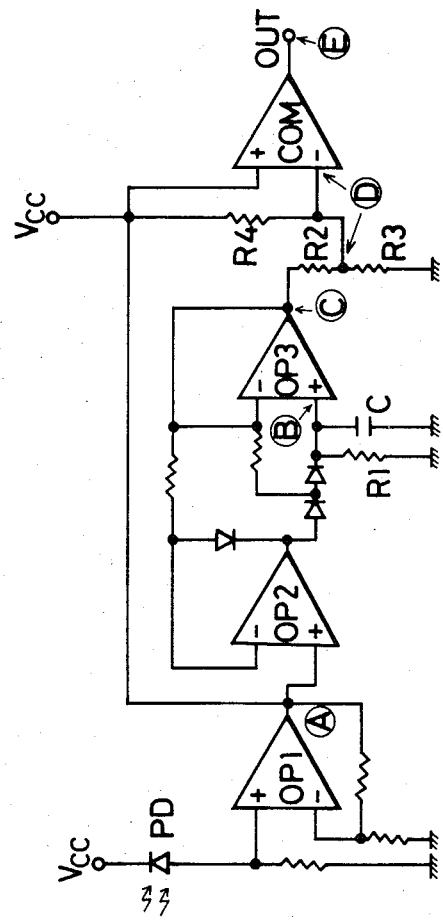
FIG. 2 shows the construction of one embodiment of the invention.
Figure 2:
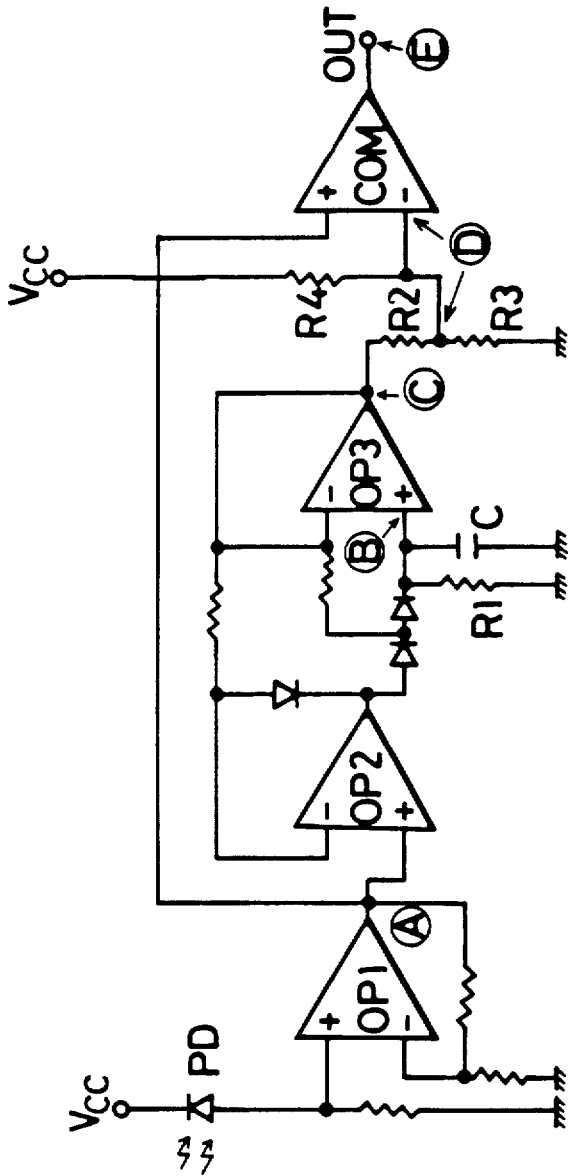

Referring to FIG. 2, an optical pulse is converted into an electric signal by a photodiode PD, amplified by an operational amplifier OP1, and output from a photoelectric conversion circuit as a potential at point A. This output is directly applied to one (plus) of the input terminals of a comparison circuit COM and at the same time is coupled to a resistor R1 and a condenser C through an operational amplifier OP2. If such an optical pulse as shown in (i) of FIG. 3 is received, the output of the photoelectric conversion circuit (potential at point A) is distorted as shown in (ii) of FIG. 3. The output with the distorted waveform is sent, as it is, to the plus terminal of the comparison circuit COM. Since voltage is applied across the condenser C (which voltage is a potential at point B) when the voltage at point A is high and is discharged through the resistor R1 when the voltage at point A is low, the voltage across the condenser C has a waveform as shown in (iii) of FIG. 3. By adapting the resistor R1 to cause the condenser C to discharge when several "off" pulses have been applied to the the former, the voltage (iii) of FIG. 3 may be made to correspond to the maximum voltage of the several "off" pulses . Since a voltage with substantially the same waveform as that of the voltage at point A is applied across a minus input terminal of the amplifier OP3, a voltage with substantially the same waveform as that of the voltage across point B occurs at an output (at point C) of an operational amplifier OP3. The voltage at point C, after reduction by being divided by resistors R2 and R3, results in voltages at points D. The voltages at points D are reduced by half as the resistance values of the resistors R2 and R3 have been made equal in advance. The comparison circuit COM compares the sizes of the waveforms of (ii) and (v) of FIG. 3, so as to provide an output voltage of (vi). Thus, an undistorted pulse train with a standarized strength is received by the present circuit. If desired, a predetermined number of bias voltages may be applied, in advance, across the minus terminal of the comparison circuit through a resistor R4, and it may be arranged that the potential at point A should be made lower than the bias voltage (as shown in (vii) of FIG. 3) whenever not a true signal light, but any extraneous light with a smaller strength has been received as a noise (which may happen, e.g., if the optical fiber has been cut), so that a malfunction of the present circuit may be prevented. It is necessary, however, to set the bias voltage at a suitable value, taking into consideration the amplification factor of the amplifier 1 and the environment in which the present circuit is used.

As seen from the foregoing description, the present invention enables optical pulse signals to be finally received in an undistorted condition and in a standarized strength. Also, the present circuit may be protected against malfunction if the optical fiber has been cut or if a similar trouble has developed.

Thus, the present circuit may be effectively used for such a transmission of data where light reception and emission is repeated in a number of steps.

Many variations of the invention will be apparent to those skilled in the art. Accordingly, the invention is not considered to be limited to the specific embodiment described herein, but only as set forth by the appended claims.

What is claimed is:
1. An optical pulse receiving device comprising:
   a. photoelectric conversion means for converting an optical pulse signal into an electric signal;
   b. peak hold means for maintaining a maximum value of a signal emitted from said photoelectric conversion means;
   c. thresholding means comprising resistors for dividing the voltage of said value of said peak hold means into two half voltages, said thresholding means setting a threshold voltage at a said half voltage; and
   d. comparison circuit means for comparing a first output signal from said photoelectric conversion means and a second output signal from said thresholding means and emitting a pulse on the basis of the comparison of said two output signals.

2. A device according to claim 1 further comprising bias means for adding a small bias voltage to the threshold voltage provided by said thresholding means, said bias means being located between said thresholding means and said comparison circuit means.

* * * * *

UNITED STATES PATENT AND TRADEMARK OFFICE
CERTIFICATE OF CORRECTION

PATENT NO. : 4,692,687   Page 1 of 2

DATED : September 8, 1987

INVENTOR(S) : Makoto Yokoyama

It is certified that error appears in the above-identified patent and that said Letters Patent is hereby corrected as shown below:

In Figure 2 and the figure appearing on page one of the patent, the (+) input to comparator COM is corrected so that it does not connect with Vcc, as shown in the attached corrected drawing.

Signed and Sealed this

Twenty-third Day of February, 1988

Attest:

DONALD J. QUIGG

Attesting Officer   Commissioner of Patents and Trademarks